United States Patent
Jang et al.

(10) Patent No.: US 12,328,175 B2
(45) Date of Patent: Jun. 10, 2025

(54) METHOD OF COMBINING COMPRESSED SIGNAL

(71) Applicant: SOLiD, Inc., Seongnam-si (KR)

(72) Inventors: Ho Sik Jang, Seongnam-si (KR); Hoo Pyo Hong, Seongnam-si (KR); Woo Jae Kim, Suwon-si (KR); Dong Hee Kwon, Yongin-si (KR); Jeong Won Kang, Yongin-si (KR)

(73) Assignee: SOLiD, Inc., Seongnam-si (KR)

( * ) Notice: Subject to any disclaimer, the term of this patent is extended or adjusted under 35 U.S.C. 154(b) by 446 days.

(21) Appl. No.: 17/727,755

(22) Filed: Apr. 24, 2022

(65) Prior Publication Data

US 2023/0023553 A1    Jan. 26, 2023

(30) Foreign Application Priority Data

Jul. 16, 2021    (KR) .................. 10-2021-0093666

(51) Int. Cl.
*H04B 7/08*     (2006.01)
*H03M 7/24*    (2006.01)
*H04B 7/155*   (2006.01)
*H04L 69/04*   (2022.01)

(52) U.S. Cl.
CPC ............ *H04B 7/0837* (2013.01); *H03M 7/24* (2013.01); *H04B 7/155* (2013.01); *H04L 69/04* (2013.01)

(58) Field of Classification Search
CPC ........ H04B 7/0837; H04B 7/155; H04B 7/24; H03M 7/24; H04L 69/04
See application file for complete search history.

(56) References Cited

U.S. PATENT DOCUMENTS

| 4,648,089 A | 3/1987 | Hsing |
| 2020/0401414 A1 | 12/2020 | Ware et al. |

FOREIGN PATENT DOCUMENTS

| EP | 3719639 A2 | 7/2020 |
| WO | 2016/098179 A1 | 6/2016 |
| WO | 2020/095718 A1 | 5/2020 |

OTHER PUBLICATIONS

Extended European Search Report mailed Oct. 17, 2022 for European Application No. 22171371.2.
Office Action mailed Oct. 28, 2022 for European Application No. 22171371.2.
O-RAN Fronthaul Working Group: "O-RAN Fronthaul Working Group; Control, User and Synchronization Plane Specification", O-RAN.WG4.CUS.0-V04.00 Technical Specification, O-RAN, US, Jul. 2020 (Jul. 1, 2020), pp. 1-258.
Non-final Office Action mailed May 9, 2023 from the Japanese Patent Office for Japanese Application No. 2022-076661.

*Primary Examiner* — Wayne H Cai
(74) *Attorney, Agent, or Firm* — Insight Law Group, PLLC; Seung Lee

(57) ABSTRACT

A method of combining compressed uplink signals according to one aspect of the present disclosure is a method of combining IQ data of uplink signals compressed without decompression by a block floating point compression method, a block scaling compression method, or a μ-law compression method.

6 Claims, 9 Drawing Sheets

METHOD OF COMBINING COMPRESSED SIGNAL

This application claims priority from Korean Patent Application No. 10-2021-0093666, filed on Jul. 16, 2021, in the Korean Intellectual Property Office, the disclosure of which is incorporated herein by reference in its entirety.

BACKGROUND

1. Field

The following description relates to a signal relay device, and more specifically, to a technology in which a signal relay device combines compressed uplink signals in a fronthaul section.

2. Description of Related Art

Competition for speed and service quality among mobile carriers around the world is accelerating. Since mobile traffic due to a video service or the like is rapidly increasing, each mobile carrier should increase base station sites, and thus a centralized/cloud RAN (C-RAN) structure was introduced to solve the problems of costs and operation. The C-RAN is a structure which separates digital units (DUs) and radio units (RUs) and collects and operates the DUs in one place, and uses a communication interface of a common public radio interface (CPRI) between the DU and RU in a long term evolution (LTE) network, and uses a communication interface of an enhanced CPRI (eCPRI) in a 5G network.

In the case of the CPRI, when transmitting a signal having a bandwidth of 20 MHz in a 2×2 MIMO structure, 2.5 Gbps is required, and a transmission amount continuously increases as a system increases. Accordingly, IQ data compression technology has been introduced in the CPRI, and the eCPRI also compresses and transmits the IQ data.

A relay device such as a distributed antenna system or the like needs to combine and transmit uplink signals received from a plurality of remote units. Since the IQ data of the CPRI or eCPRI is generally compressed and used, the distributed antenna system decompresses and sums the compressed signals to combine the uplink signals, and then compresses the summed signal and transmits the signal to an upper node. Since decompression and compression processes additionally occur in a process of combining the signals, there is a problem in that a delay in signal transmission occurs.

SUMMARY

This summary is provided to introduce a selection of concepts in a simplified form that are further described below in the Detailed Description. This summary is not intended to identify key features or essential features of the claimed subject matter, nor is it intended to be used as an aid in determining the scope of the claimed subject matter.

The present disclosure is directed to providing a method of combining compressed IQ data of uplink signals without decompression in a fronthaul section.

A method of processing compressed uplink signals according to one aspect of the present disclosure includes a signal receiving operation, an input data processing operation, a pre-processing operation, a combining operation, and a post-processing operation.

The method of processing compressed uplink signals may be a method in which a signal relay device processes compressed IQ data in a fronthaul section between digital units (DUs) and radio units (RUs).

The signal receiving operation may be an operation of receiving compressed uplink signals from two or more radio units, the input data processing operation may be an operation of extracting common parameters in resource block units and sample data from the compressed uplink signals to be combined, the pre-processing operation may be an operation of determining the common parameters to be used for a combining result among the common parameters extracted from the uplink signals and changing the sample data based on the determined common parameters, the combining operation may be an operation of summing the sample data in a compressed state, and the post-processing operation may be an operation of checking whether an overflow occurs in the combining operation and processing the occurring overflow.

Figure 1:
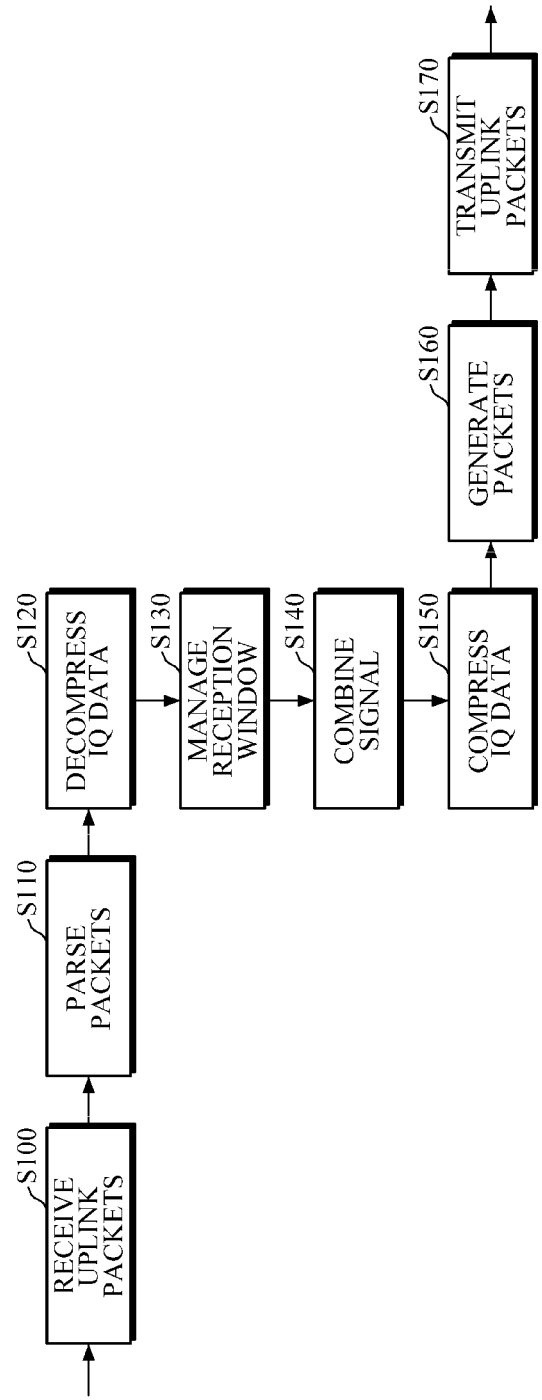
FIG. 1 illustrates a concept of a process of combining compressed IQ data in the related art.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

The above-described and additional aspects are realized through embodiments described with reference to the accompanying drawings. It is understood that elements of the embodiments may be variously combined within the embodiments unless otherwise mentioned or as long as there is no contradiction. Each block in a block diagram may represent a physical component in some cases, but may logically represent a part of a function of one physical component or a function throughout a plurality of physical components in other cases. Sometimes, the entity of a block or a part of the block may be a set of program instructions. All or a part of these blocks may be realized by hardware, software, or a combination thereof.

A signal relay device to which a method of combining compressed uplink signals of the present disclosure is applied is a device that is located in a fronthaul section between digital units and radio units of a centralized/cloud RAN (C-RAN) structure and duplicates downlink signals directed to the radio units from the digital units and transmits the downlink signals to a plurality of radio units, and combines uplink signals received from the plurality of radio units into one uplink signal and transmits the uplink signal to the digital units.

For convenience of description, it is described that a fronthaul communication protocol uses an enhanced common public radio interface (eCPRI), and IQ data is compressed and transmitted.

FIG. 1 illustrates a concept of a process of combining compressed IQ data in the related art. The eCPRI is transmitted through the Ethernet and the IQ data is compressed and transmitted in packets. The eCPRI is physically transmitted through an optical cable due to high transmission demands. As shown in FIG. 1, uplink packets are received (S100), the signal relay device parses the packets according to an O-RAN standard (S110). After understanding a compression method using a packet parsing result, the IQ data is decompressed (S120) and stored. In this case, the signal relay device stores decompressed packets in a memory such as a buffer or the like, and manages the packets received from the plurality of radio units so that a buffer overflow does not occur (manage reception window, S130). The signal relay device extracts signal data to be combined from the packets stored in a reception buffer and then sums the signals (S140). After summing, the signal relay device compresses the IQ data of the summed result using the received original compression method or a compression method set in the device (S150), generates as packets of the O-RAN standard (S160), and transmits the uplink packets to the digital unit (S170).

As shown in FIG. 1, according to the related art, in order to combine and transmit the uplink signals, the compressed IQ data is decompressed, the IQ data is summed, and the IQ data is compressed again and transmitted. Further, since this process repeatedly occurs as the number of radio units connected to the signal relay device is large, there is a problem in that a delay due to decompression and recompression occurs.

Figure 2:
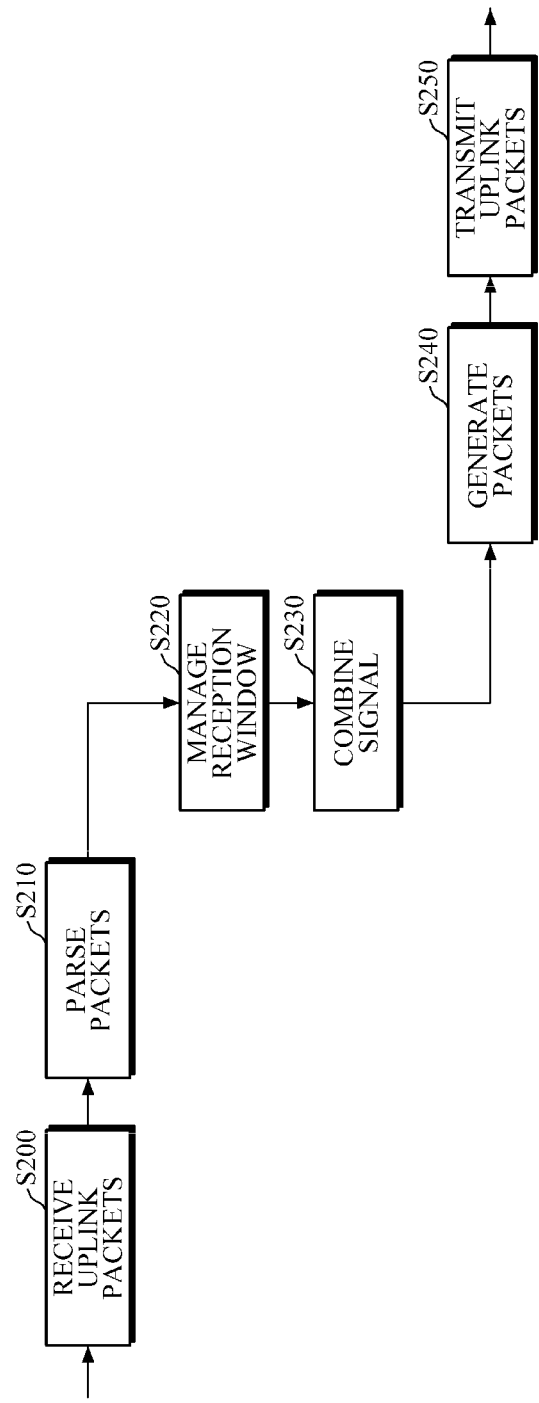
FIG. 2 illustrates a concept of a process of combining compressed IQ data in the present disclosure.

FIG. 2 illustrates a concept of a process of combining compressed IQ data in the present disclosure. Unlike FIG. 1, in the present disclosure, compressed IQ data of received packets is directly combined without decompression. In a description with reference to FIG. 2, when uplink packets are received (S200), the signal relay device parses the packets according to an O-RAN standard (S210). In this case, the signal relay device stores packets received in a memory such as a buffer or the like, and manages packets received from a plurality of radio units so that a buffer overflow does not occur (manage reception window, S220). The signal relay device extracts signal data to be combined from the packets stored in a reception buffer and then sums the signals in a compressed state without decompression (S230). After summing, the signal relay device generates the summed result as packets of the O-RAN standard (S240), and transmits the uplink packets to the digital unit (S250).

Like the above, according to the present disclosure, since a process of decompressing the IQ data and recompressing the summed result in the combining process is omitted, a delay required for combining is reduced compared to the related art.

Figure 3:
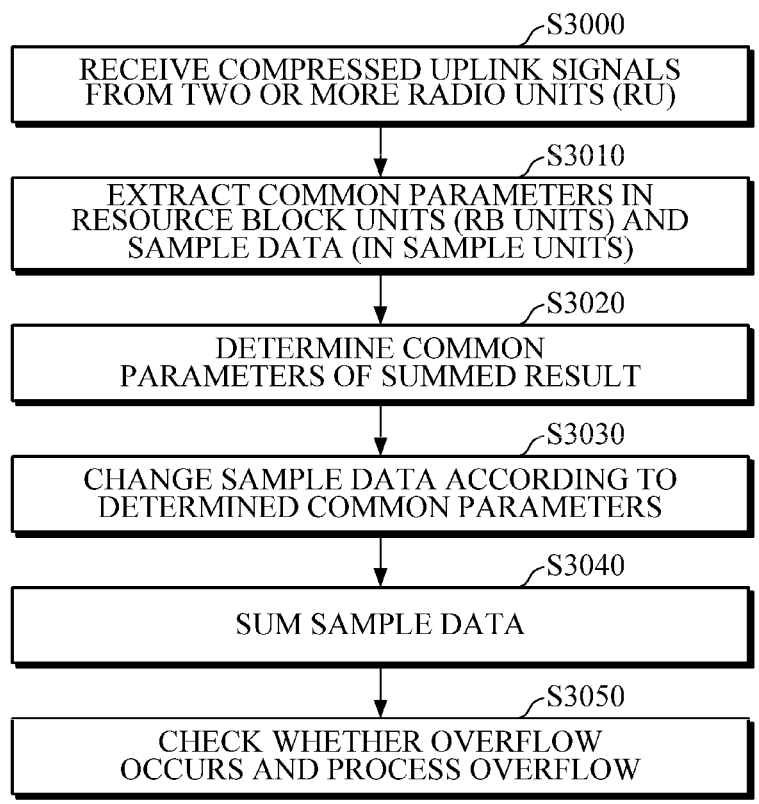
FIG. 3 is a flow chart of a method of combining compressed IQ data according to one aspect of the present disclosure.

FIG. 3 is a flow chart of a method of combining compressed IQ data according to one aspect of the present disclosure. In a description with reference to FIG. 3, a method of processing compressed uplink signals according to one aspect of the present disclosure includes a signal receiving operation of receiving uplink signals, an input data processing operation of extracting common parameters and sample data, a pre-processing operation of determining the common parameters and changing the sample data, a combining operation of summing the sample data, and a post-processing operation of processing the occurrence of an overflow, thereby combining compressed IQ data included in the uplink signals.

The method of processing compressed uplink signals is a method in which a signal relay device processes the IQ data in a fronthaul section between digital units (DUs) and radio units (RUs) of a C-RAN structure. The signal relay device is a device which performs an O-RAN standard fronthaul multiplexer function, and may be a headend unit of a distributed antenna system.

The signal relay device may be connected to a plurality of radio units. The plurality of radio units may belong to one cell or may be distributed and belong to a plurality of cells. When the uplink signals are combined, the signal relay device combines the uplink signals transmitted from the radio units which belong to the same cell.

The signal receiving operation is an operation in which the signal relay device receives the compressed uplink signals from two or more radio units (S3000). Since the signal relay device of the present disclosure combines the IQ data in a compressed state, unlike the related art, the packets received from the radio units are stored in a reception buffer in a compressed state. However, in the signal receiving operation, U-plane data defined in the O-RAN is parsed and then stored in the reception buffer.

The input data processing operation is an operation in which the signal relay device selects the uplink signals to be combined transmitted from the radio units which belong to the same cell from the packets stored in the reception buffer, and extracts the common parameters in resource block units and the sample data from the compressed uplink signals to be combined (S3010). The common parameters may have different meanings according to a method of compressing IQ data. For example, when the method of compressing IQ data is a block floating point compression method, the common parameter is an exponent transmitted in units of resource blocks, and this exponent refers to an exponent of a mantissa, which is sample data of each sample unit. Compression method information is included in udCompHdr of the parsed U-plane data.

The pre-processing operation is an operation in which the signal relay device determines the common parameters to be used for a combining result among the common parameters extracted from the uplink signals (S3020), and changes the sample data based on the determined common parameters (S3030), that is, an operation of aligning the digits of data to be combined (a bit align operation). Since the number of digits of a value of the sample data is different according to a value of the common parameter, the sample data may not be simply summed. The pre-processing operation is an operation of aligning the digits by performing a bit shift operation so that the sample data may be simply summed in the combining operation to be described later.

The combining operation is an operation of summing the sample data in a compressed state (S3040), and is an operation of performing an operation of simply adding the sample data which is a bit string.

The post-processing operation is an operation of checking whether an overflow occurs in the combining operation and processing the generated overflow (S3050).

A method of processing compressed uplink signals according to another aspect of the present disclosure includes a signal receiving operation of receiving uplink signals compressed by the block floating point compression method, an input data processing operation of extracting exponents which are the common parameters and mantissas which are the sample data, a pre-processing operation of determining the exponent and changing the mantissa, a combining operation of summing the sample data, and a post-processing operation of processing the occurrence of an overflow, thereby combining IQ data compressed by the block floating point compression method and included in the uplink signals.

The signal receiving operation, the input data processing operation, and the combining operation are the same as the above-described signal receiving operation. However, the common parameter is floating point exponent data, and the sample data is mantissa data.

In the pre-processing operation, the signal relay device determines the largest exponent among the common parameters extracted from the uplink signals, that is, the exponent data, as the exponent to be used for the combining result. When the exponent data is different, the sample data, that is, the mantissa data, may not be summed as it is. The mantissa data should be changed so that the exponent data is the same. Accordingly, mantissas each having the small exponent value are changed through a shift operation based on the determined exponent data to match the determined exponent data.

The post-processing operation checks whether the overflow occurs in the combining operation. In the case of the block floating point compression method, the overflow does not occur when signs of two pieces of data to be summed are different. Accordingly, the signal relay device may check whether the overflow occurs only when the signs of the data to be summed are the same. The signal relay device increases a value of the common parameter, that is, a value of the exponent, to be used for the combining result by 1 when the overflow occurs according to a result of checking an overflow occurrence, and shifts the summed mantissa data to the right by 1 bit (the same as division by 2 through an arithmetic operation).

Figure 4:
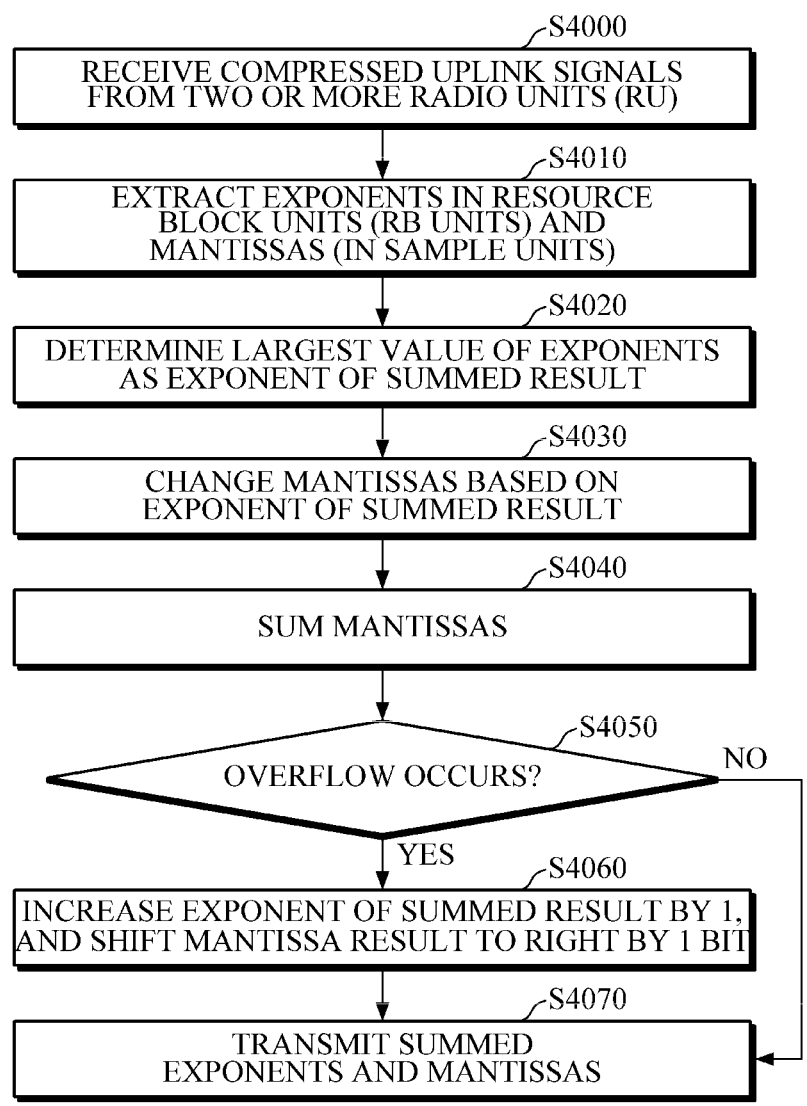
FIG. 4 illustrates a procedure of combining IQ data compressed by a block floating point compression method according to another aspect of the present disclosure.

FIG. 4 illustrates a procedure of combining IQ data compressed by the block floating point compression method according to another aspect of the present disclosure. In a description with reference to FIG. 4, the signal relay device receives uplink signals in which the IQ data is compressed by the block floating point compression method from two or more radio units (S4000). The signal relay device selects the data of two radio units to be combined, and extracts exponents in resource block units and mantissas in sample units from the corresponding data (S4010). The signal relay device determines the larger value of the exponents as the exponent of the summed result (S4020), and changes the mantissas of exponents other than the exponent of the summed result through a shift operation to match the exponent of the summed result (S4030). The signal relay device sums the mantissas (S4040), and checks whether an overflow occurs in the summing process (S4050). When the overflow occurs as a result of checking, the signal relay device increases the exponent of the summed result by 1, and shifts the mantissa to the right by 1 bit to process the overflow (S4060). The signal relay device transmits the exponent and mantissa of the summed result as the summed result (S4070).

Figure 5:
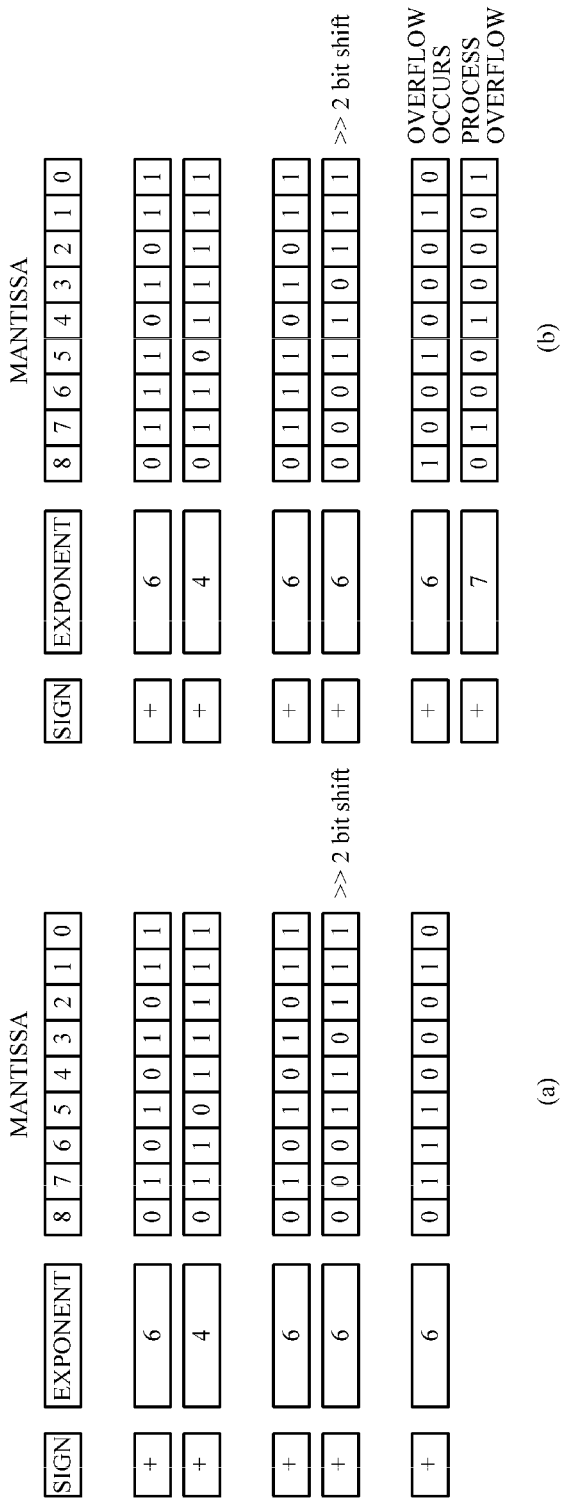
FIG. 5 illustrates an example in which the IQ data compressed by the block floating point compression method according to the present disclosure is combined.

FIG. 5 illustrates an example in which the IQ data compressed by the block floating point compression method according to the present disclosure is combined. FIG. 5A illustrates an example in which the overflow does not occur, and FIG. 5B illustrates an example in which the overflow occurs and is processed.

First, in a description with reference to FIG. 5A which is an example in which the overflow does not occur, as an example in which a mantissa having an exponent of 6 and a mantissa having an exponent of 4 are summed, the signal relay device performs a 2-bit shift operation to the right to change the mantissa having the exponent of 4 to the mantissa having the exponent of 6, and then sums the mantissas. Since a result of the most significant bit is not changed and thus the overflow does not occur, the signal relay device outputs the exponent and the mantissa of the summed result.

In a description with reference to FIG. 5B which is an example in which the overflow occurs, the signal relay device changes and sums the mantissas in the same manner as FIG. 5A. According to the summed result, it can be seen that the most significant bit is 1, which is different from a value before summing, and thus the overflow occurs. The signal relay device increases the exponent by 1 from 6 to 7, shifts the mantissa to the right by 1 bit, and then outputs the exponent and the mantissas to process the overflow.

A method of processing compressed uplink signals according to another aspect of the present disclosure includes a signal receiving operation of receiving uplink signals compressed by a block scaling compression method, an input data processing operation of extracting data scaled by block scalers which are common parameters and block scalers which are sample data, a pre-processing operation of determining the block scalers and changing the scaled data, a combining operation of summing the sample data, and a post-processing operation processing the occurrence of an overflow, thereby combining IQ data compressed by the block scaling compression method and included in the uplink signals.

The signal receiving operation, the input data processing operation, and the combining operation are the same as the above-described signal receiving operation. However, the common parameters are the block scalers, and the sample data is data scaled by the block scalers.

In the pre-processing operation, the signal relay device determines the largest block scaler among the common parameters extracted from the uplink signals, that is, the block scalers, as the block scaler to be used for the combining result. When the block scalers are different, the sample data may not be summed as it is. The sample data should be changed so that the block scalers become the same.

The signal relay device acquires an inverse block scaler value of the large block scaler to change the sample data of the small block scaler. In this case, the inverse block scaler value is a value in which $2^7$ is divided by the block scaler value when the block scaler value is defined as a fixed point in the Q1.7 format, and the inverse block scaler value may be stored in a table for efficiency of calculation. The signal relay device multiplies the small block scaler value by the acquired inverse block scaler value, multiplies the sample data of the small block scaler by a multiplication result, and performs a right shift operation to align digits.

The following Equation 1 is an equation which indicates that a result of decompressing and summing the IQ data compressed by the block scaling compression method and a result of summing the IQ data without decompression are the same.

$$[Equation\ 1]$$

$$Y = X1 \times sblockScaler1 + X2 \times sblockScaler2$$
$$= sblockScaler1 \times \left( X1 + X2 \times \frac{sblockScaler2}{sblockScaler1} \right)$$
$$= sblockScaler1 \times (X1 + (X2 \times sblockScaler2 \times InverseSblockScaler1 \gg 7))$$

$$\text{where } InverseSblockScaler1 = \frac{2^7}{sblockScaler1}, sblockScaler1 > sblockScaler2$$

X1 and X2 are sample data, sblockScaler1 and sblockScaler2 are block scalers, and InverseSblockScaler1 is a sub-expression which indicates a process in which the inverse block scaler (X2×sblockScaler2×InverseSblockScaler1>>7) of sblockScaler1 changes the sample data of the small block scaler in the pre-processing operation.

The post-processing operation checks whether the overflow occurs in the combining operation. The signal relay device shifts a value of the common parameter to be used for the combining result when the overflow occurs as the result of checking the overflow occurrence, that is, a value of the block scaler to the left by 1 bit, and shifts the summed sample data to the right by 1 bit.

Figure 6:
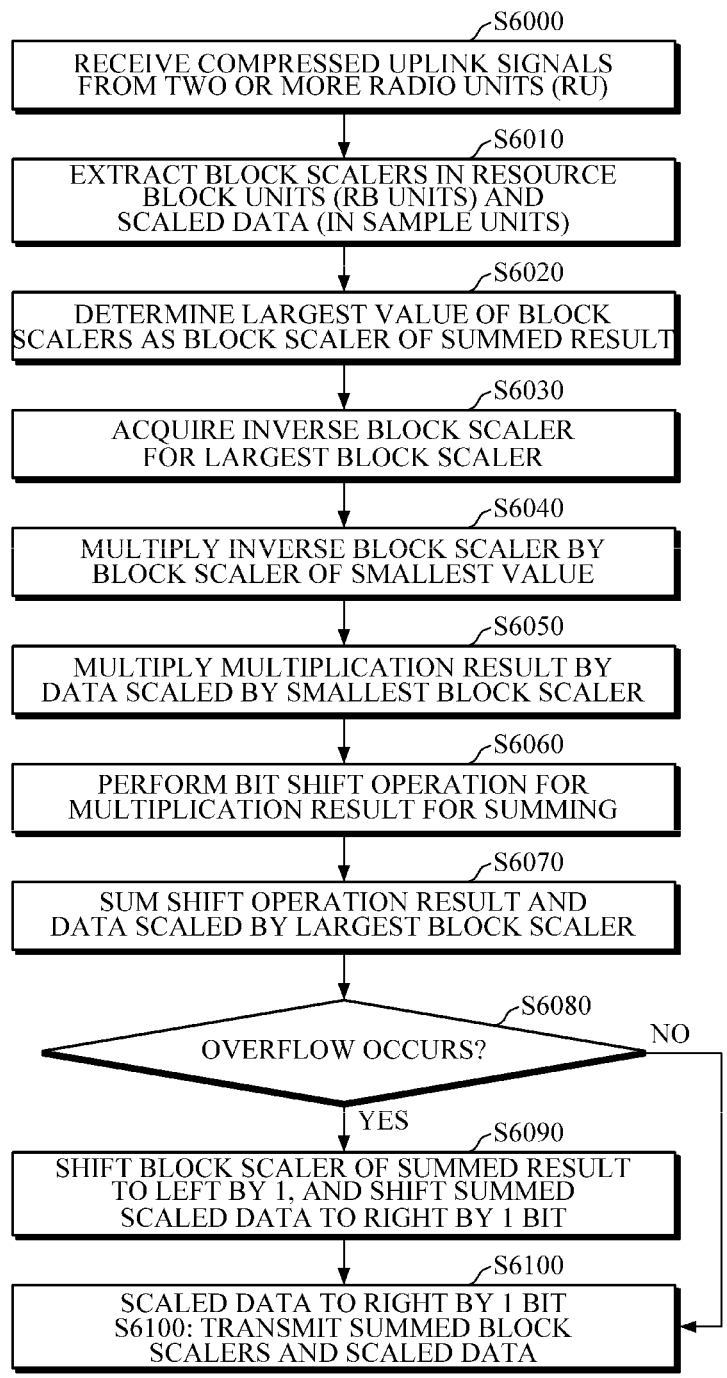
FIG. 6 illustrates a procedure of combining IQ data compressed by a block scaling compression method according to still another aspect of the present disclosure.

FIG. 6 illustrates a procedure of combining IQ data compressed by the block scaling compression method according to still another aspect of the present disclosure. In a description with reference to FIG. 6, the signal relay device receives uplink signals in which the IQ data is compressed by the block scaling compression method from two or more radio units (S6000). The signal relay device selects the data of two radio units to be combined, and extracts block scalers in resource block units and sample data in sample units from the corresponding data (S6010). The sample data is data scaled by the block scaler. The signal relay device determines the larger value of the block scalers as the block scaler of the summed result (S6020), and acquires an inverse block scaler for the large block scaler (S6030) to multiply the inverse block scaler by the block scaler of the small value (S6040), and then multiplies the result by the sample data of the small block scaler (S6050), shifts the multiplication result to the right by N bits (when the block scaler is defined as Q1.7, N is 7, that is, the number of decimal bits in fixed point representation of the block scaler) (S6060), and sums the multiplication result to the sample data of the large block scaler (S6070). The signal relay device checks whether the overflow occurs in the summing process (S6080). When the overflow occurs as a result of checking, the signal relay device shifts the block scalers of the summed result to the left by 1 bit, and shifts the sample data, that is, the summed scaled data to the right by 1 bit to process the overflow (S6090). The signal relay device transmits the block scaler and the sample data of the summed result as the summed result (S6100).

The method of processing compressed uplink signals according to still another aspect of the present disclosure includes a signal receiving operation of receiving uplink signals compressed by a Ч-law compression method, an input data processing operation of extracting compression shifts (compShifts) which are common parameters and signs and mantissas which are sample data, a pre-processing operation of determining the compression shifts (compShifts) and changing the mantissas, a combining operation of summing the mantissas, and a post-processing operation processing the occurrence of an overflow, thereby combining IQ data compressed by the Ч-law compression method and included in the uplink signals.

The signal receiving operation, the input data processing operation, and the combining operation are the same as the above-described signal receiving operation. However, the common parameters are the compression shifts (compShifts), and the sample data is the signs and the mantissas.

In the pre-processing operation, the signal relay device determines the smallest compression shifts (compShift) among the common parameters extracted from the uplink signals, that is, the compression shifts (compShifts), as the compression shifts (compShifts) to be used for the combining result. When the compression shifts (compShifts) are different, the sample data may not be summed as it is. The sample data should be changed so that the compression shifts (compShifts) become the same.

The signal relay device changes each piece of sample data based on the compression shift (compShift) and upper two bits of the mantissa. In a sample data change method, the signal relay device changes the mantissa (a compBitWidth size of U-plane IQ data format) to a 1 bit larger value (compBitWidth+1), changes a value of the upper 2 bits to 0, combines the remaining bits other than the upper 2 bits to a bit 1, and then shifts the bit 1 to the left by 2 bits when the value of the upper 2 bits is 3, changes the value of the upper 2 bits to 0, combines the remaining bits other than the upper 2 bits to the bit 1, and then shifts the bit 1 to the left by 1 bit when the value of the upper 2 bits is 2, and changes the value of the upper 2 bits to 0, and then combines the remaining bits other than the upper 2 bits to a bit string corresponding to the value of the upper 2 bits when the value of the upper 2 bits is 0 or 1.

The post-processing operation checks whether the overflow occurs in the combining operation. In the case of the Ч-law compression method, the overflow does not occur when signs of two pieces of data to be summed are different. Accordingly, the signal relay device may check whether the overflow occurs only when the signs of the data to be summed are the same. The signal relay device reduces a value of the common parameter, that is, a value of the compression shift (compShift), to be used for the combining result by 1 when the overflow occurs as the result of checking the overflow occurrence, and sets the value of the upper 2 bits as 3, and sets the remaining bits as a value of the remaining upper bits in the summed mantissa data (set upper compBitWidth−2 bits as lower bits of the mantissa). When the overflow does not occur, the signal relay device sets the upper 2 bits as a value of 4—a position where an initial 1 appears according to the position where the initial 1 appears from the left of the summed mantissa, and sets the upper 2 bits as 0 when the position where the initial 1 appears is 4 or more.

Figure 7:
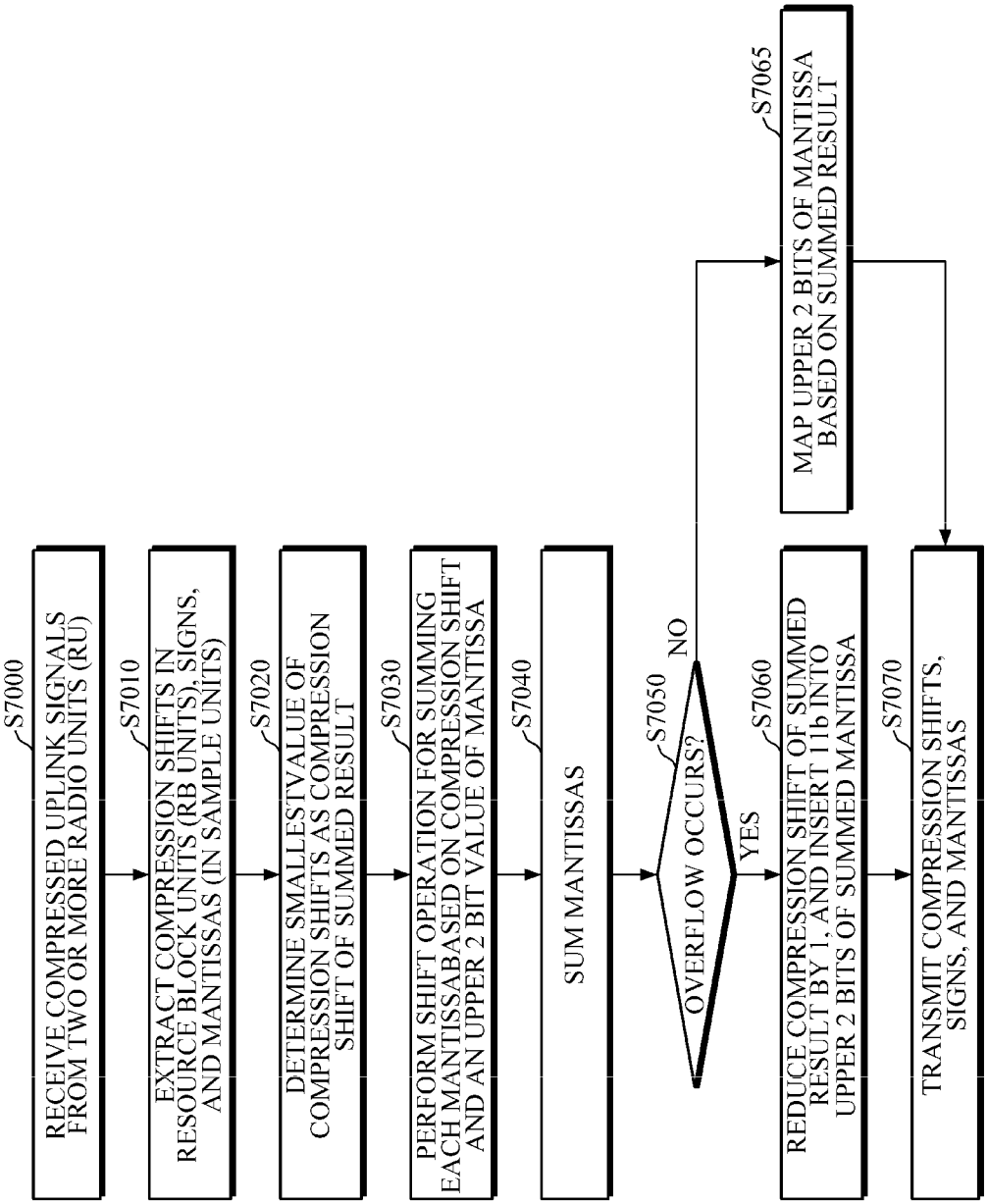
FIG. 7 illustrates a procedure of combining IQ data compressed by a $\mu$-law compression method according to yet another aspect of the present disclosure.

FIG. 7 illustrates a procedure of combining IQ data compressed by the Ч-law compression method according to yet another aspect of the present disclosure. In a description with reference to FIG. 7, the signal relay device receives uplink signals in which the IQ data is compressed by the Ч-law compression method from two or more radio units (S7000). The signal relay device selects the data of two radio units to be combined, and extracts compression shifts (compShifts) in resource block units and signs and mantissas in sample units from the corresponding data (S7010). The signal relay device determines the small value of the compression shifts (compShifts) as the compression shift (compShift) of the summed result (S7020), and performs a shift operation for summing each mantissa based on the compression shift (compShift) and an upper 2 bit value of the mantissa (S7030). The signal relay device sums the mantissas (S7040), and checks whether the overflow occurs in the summing process (S7050). When the overflow occurs as a result of checking, the signal relay device reduces the compression shift (compShift) of the summed result by 1 and inserts 3 into the upper 2 bits of the mantissa (S7060). When the overflow does not occur as the result of checking, the upper 2 bits of the mantissa are mapped based on the summed result (S7065). The signal relay device transmits the compression shift (compShift), the sign and the mantissa of the summed result as the summed result (S7070). In this case, the mantissa is converted by extending by 1 bit, and the number of bits of the mantissa is reduced by 1 bit in overflow processing. In order to increase precision of the data, the number of bits which will extend may be set to be larger than 1 bit.

Figure 8:
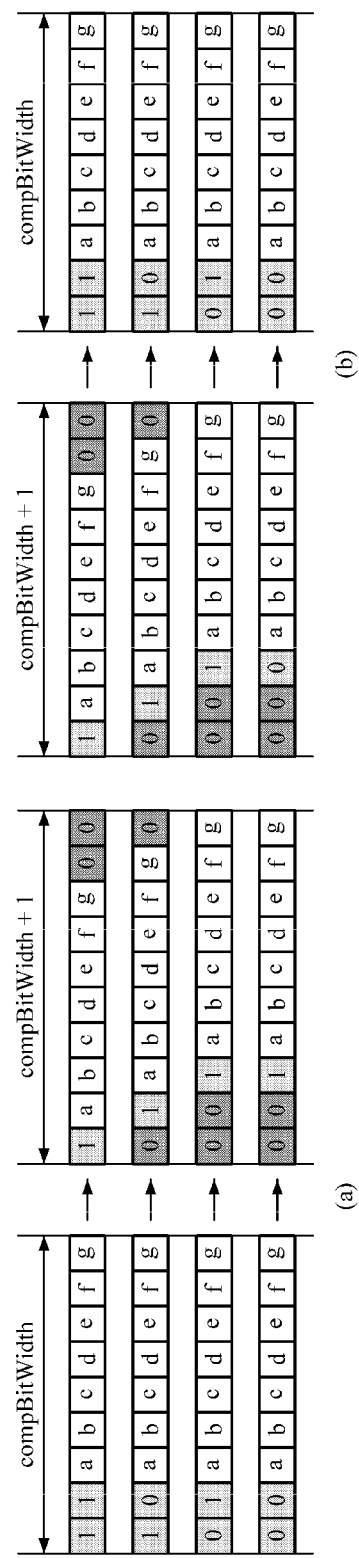
FIG. 8 illustrates a concept of processing upper 2-bit mapping of a mantissa in the procedure shown in FIG. 7.

FIG. 8 illustrates a concept of processing upper 2-bit mapping of the mantissa in the procedure shown in FIG. 7. FIG. 8A illustrates a concept of converting the mantissa in the pre-processing operation. In FIG. 8A, the mantissa is changed from data of a comBitWidth bit size to data of a comBitWidth+1 bit size.

When the most significant bit is 11$b$, after setting the most significant bit as 00$b$, 1$b$ is combined with the remaining bits (bit string abcdefg) other than the upper 2 bits of an original mantissa, and then is shifted to the left by 2 bits (a bit string 11abcdefg is changed to 1abcdefg00).

When the most significant bit is 10$b$, after setting the most significant bit as 00$b$, 1$b$ is combined with the remaining bits (bit string abcdefg) other than the upper 2 bits of an original mantissa, and then is shifted to the left by 1 bit (a bit string 10abcdefg is changed to 01abcdefg0).

When the most significant bit is 01$b$, after setting the most significant bit as 00$b$, a bit string (1$b$) of a value corresponding to the most significant bit is combined with the remaining bits (bit string abcdefg) other than the upper 2 bits of the original mantissa (a bit string 01abcdefg is changed to 001abcdefg).

When the most significant bit is 00$b$, after setting the most significant bit as 00$b$, a bit string (0$b$) of a value corresponding to the most significant bit is combined with the remaining bits (bit string abcdefg) other than the upper 2 bits of the original mantissa (a bit string 00abcdefg is changed to 000abcdefg).

FIG. 8B illustrates a concept of converting the mantissa in the post-processing operation. In FIG. 8B, the mantissa is changed from data of a comBitWidth+1 bit size to data of a comBitWidth bit size.

When a position where an initial bit 1 appears is a first bit from the left, an upper bit is set as 11$b$, and the remaining compBitWidth−2 bits (abcdefg) after the initial 1 are set as lower bits of the mantissa (a bit string 1abcdefg00 is changed to 11abcdefg).

When the position where the initial bit 1 appears is a second bit from the left, the upper bit is set as 10$b$, and the remaining compBitWidth−2 bits (abcdefg) after the initial 1 are set as lower bits of the mantissa (a bit string 01abcdefg0 is changed to 10abcdefg).

When the position where the initial bit 1 appears is a third bit from the left, the upper bit is set as 01$b$, and the remaining compBitWidth−2 bits (abcdefg) after the initial 1 are set as lower bits of the mantissa (a bit string 001abcdefg is changed to 01abcdefg).

When the position where the initial bit 1 appears is a fourth bit or more from the left, the upper bit is set as 00$b$, and the remaining compBitWidth−2 bits (abcdefg) after the initial 1 are set as lower bits of the mantissa (a bit string 000abcdefg00 is changed to 00abcdefg).

Figure 9:
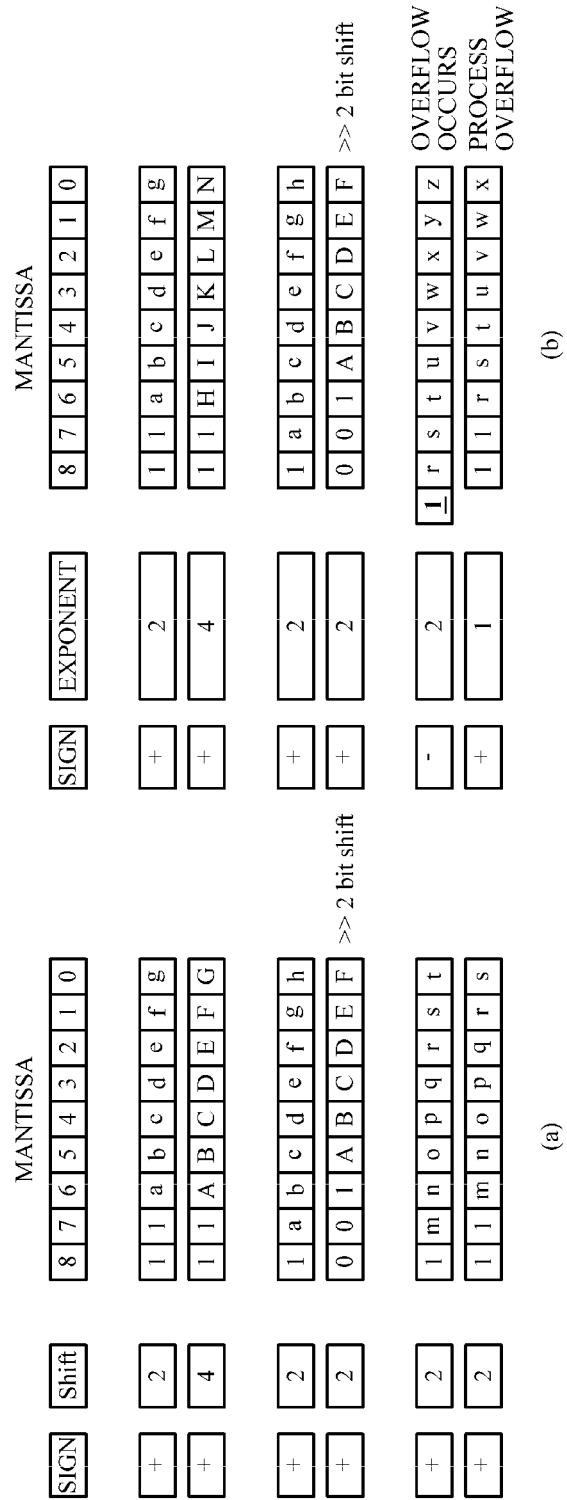
FIG. 9 illustrates an example in which the IQ data compressed by the $\mu$-law compression method according to the present disclosure is combined.

FIG. 9 illustrates an example in which the IQ data compressed by the $\mu$-law compression method according to the present disclosure is combined. FIG. 9A illustrates an example in which the overflow does not occur, and FIG. 9B illustrates an example in which the overflow occurs and is processed.

First, in a description with reference to FIG. 9A which is an example in which the overflow does not occur, as an example in which a mantissa having a compShift of 6 and a mantissa having a compShift of 4 are summed, the signal relay device changes each mantissa in the method shown in FIG. 8A, performs a 2-bit shift operation to the right to change the mantissa having the compShift of 4 to the mantissa having the compShift of 2, and sums the mantissas. The signal relay device outputs the compShifts, the signs, and the mantissas of the summed result by mapping the summed result in the method shown in FIG. 8B.

In a description with reference to FIG. 9B which is an example in which the overflow occurs, the signal relay device changes and sums the mantissas in the same manner as FIG. 9A. According to the summed result, since the overflow occurs, the signal relay device reduces the compShift by 1 (from 2 to 1), and inserts 11$b$ which is the most significant 2 bits of the mantissa to process the overflow.

According to a method of combining compressed uplink signals of the present disclosure, since a signal relay device can combine compressed IQ data of uplink signals without decompression in a fronthaul section, a delay due to signal combining can be minimized.

In the above, although the present disclosure has been described with reference to the accompanying drawings, the present disclosure is not limited thereto, and should be understood to encompass various modifications which may be clearly derived by those skilled in the art. The claims are intended to encompass these modifications.

What is claimed is:

1. A method of combining compressed uplink signals by a signal relay device in a fronthaul section, the method comprising:
    a signal receiving operation of receiving compressed uplink signals from two or more radio units, wherein the compressed uplink signals are compressed by a block floating point compression method;
    an input data processing operation of extracting common parameters in resource block units and sample data from the compressed uplink signals to be combined, wherein the common parameters comprise an exponent of the floating point, and wherein the sample data comprises a mantissa of the floating point;
    a pre-processing operation of determining a largest value among the common parameters as a common parameter to be used for a combining result and changing the sample data based on the determined common parameter;
    a combining operation of summing the changed sample data without decompression; and a post-processing operation of checking whether overflow occurs in the combining operation and processing the occurring overflow.

2. The method of claim 1, wherein a value of the common parameter to be used for the combining result when the overflow occurs in the combining operation is increased by 1, and the summed sample data is shifted to the right by 1 bit in the post-processing operation.

3. A method of combining compressed uplink signals by a signal relay device in a fronthaul section, the method comprising:
- a signal receiving operation of receiving compressed uplink signals from two or more radio units, wherein the compressed uplink signals are compressed by a block scaling compression method;
- an input data processing operation of extracting common parameters in resource block units and sample data from the compressed uplink signals to be combined, wherein the common parameters comprise block scalers, and wherein the sample data comprises a value scaled by the block scaler;
- a pre-processing operation of determining a largest value among the common parameters as a common parameter to be used for a combining result and changing the sample data based on the determined common parameter;
- a combining operation of summing the changed sample data without decompression;
- and a post-processing operation of checking whether overflow occurs in the combining operation and processing the occurring overflow.

4. The method of claim 3, wherein a value of the common parameter to be used for the combining result when the overflow occurs in the combining operation is shifted to the left by 1 bit, and the summed sample data is shifted to the right by 1 bit in the post-processing operation.

5. A method of combining compressed uplink signals by a signal relay device in a fronthaul section, the method comprising:
- a signal receiving operation of receiving compressed uplink signals from two or more radio units, wherein the compressed uplink signals are compressed by a y-law compression method;
- an input data processing operation of extracting common parameters in resource block units and sample data from the compressed uplink signals to be combined, wherein the common parameters comprise a compression shift, and wherein the sample data comprises a mantissa shifted to left by a sign and a compression shift value;
- a pre-processing operation of determining a smallest value among the common parameters as a common parameter to be used for a combining result and each piece of sample data is changed based on the common parameter and upper 2 bits of the sample data;
- a combining operation of summing the changed sample data without decompression; and
- a post-processing operation of checking whether overflow occurs in the combining operation and processing the occurring overflow.

6. The method of claim 5, wherein a value of the common parameter to be used for the combining result when the overflow occurs in the combining operation is reduced by 1, and 3 is inserted into upper 2 bit positions of the summed sample data in the post-processing operation.

* * * * *